United States Patent [19]

Czupryna et al.

[11] Patent Number: 4,604,273
[45] Date of Patent: Aug. 5, 1986

[54] PROCESS FOR THE GROWTH OF ALPHA SILICON NITRIDE WHISKERS

[75] Inventors: Gary Czupryna; Samuel Natansohn, both of Sharon, Mass.; Robert A. Long, Towanda; Robin W. Munn, Sayre, both of Pa.

[73] Assignees: GTE Products Corporation, Stamford, Conn.; GTE Laboratories Incorporated, Waltham, Mass.

[21] Appl. No.: 725,043

[22] Filed: Apr. 19, 1985

[51] Int. Cl.[4] .......................................... C01B 21/068
[52] U.S. Cl. .................................. 423/344; 423/406; 501/97
[58] Field of Search .................... 501/97; 423/344, 406

[56] References Cited

U.S. PATENT DOCUMENTS

| | | | |
|---|---|---|---|
| 3,244,480 | 4/1966 | Johnson et al. | 23/191 |
| 4,017,319 | 4/1977 | Greskouch et al. | 501/97 |
| 4,117,095 | 9/1978 | Komeya et al. | 423/344 |
| 4,122,140 | 10/1978 | Greskouch et al. | 501/97 |
| 4,122,152 | 10/1978 | Mori et al. | 423/344 |
| 4,368,180 | 1/1983 | Inoue et al. | 501/97 |
| 4,388,255 | 6/1983 | Simpson | 264/29.1 |

FOREIGN PATENT DOCUMENTS

| | | | |
|---|---|---|---|
| 0080050 | 6/1983 | European Pat. Off. | |
| 0152271 | 8/1984 | Japan | 501/97 |
| 1028977 | 5/1966 | United Kingdom | 423/344 |

OTHER PUBLICATIONS

J. V. Milewski, F. D. Gac, and J. J. Petrovic Rpt. DE 83008282, Los Alamos National Laboratory, Feb. 1983.
W. P. Clancy Microscopy 22, 279 (1974).
Chemical Abstract 88:15348k Effects of Very Small Components on the Nitridation of Silica Carbon Mixtures."
R. M. Gill et al, *The Refractories Journal*, "Self Bonded Silicon Nitride", Mar. 1962, pp. 92–94.

*Primary Examiner*—John Doll
*Assistant Examiner*—Jackson Leeds
*Attorney, Agent, or Firm*—Ivan L. Ericson

[57] ABSTRACT

A process for the growth of silicon nitride whiskers consists of reacting a mixture of carbon and silicon dioxide powders at elevated temperature in a stream of nitrogen, said reaction mixture containing small amounts of metals such as chromium, magnesium, and nickel which promote the growth of silicon nitride whiskers by vapor phase transport. The whiskers obtained as a result of this invention are of much higher purity than those obtained by prior art.

5 Claims, 3 Drawing Figures

PROCESS FOR THE GROWTH OF ALPHA SILICON NITRIDE WHISKERS

FIELD OF THE INVENTION

This invention relates to a process for producing ceramic whiskers. More particularly, this invention relates to a process for producing high purity silicon nitride whiskers.

BACKGROUND OF THE INVENTION

The incorporation of whisker or fiber materials in a ceramic, glass or metal matrix has often resulted in improved mechanical properties of the resulting composites. The use of reinforcing whiskers to improve the fracture toughness of structural ceramics such as silicon carbide or silicon nitride has been advocated so as to make these materials more resistant to the mechanical and thermal stresses inherent in exacting applications such as advanced vehicular engine components. In making ceramic composites for these demanding applications it is preferred to use whiskers of the same composition so as not to compromise the excellent material properties of a monolithic ceramic such as silicon nitride by the admixture of a material with inferior characteristics. However, silicon nitride whiskers of the requisite purity for ceramic engine applications are not available.

Thus, a commercially available silicon nitride whisker product made by Tateho Chemical Industries of Japan contains large amounts of impurities, particularly calcium and iron, which adversely affect the high-temperature strength and oxidation resistance of silicon nitride. Another process for the growth of $Si_3N_4$ whiskers (J. V. Milewski, F. D. Gac and J. J. Petrovic, Rpt. DE83008282, Los Alamos National Laboratory, Feb. 83) uses stainless steel as a catalyst which also results in unacceptable levels of iron contamination. Other techniques alluded to in an article by W. P. Clancy [Microscopy, 22, 279, (1974)] consist either of high temperature and high pressure (1800° C. at 275 psi) or long treatment (24 to 48 hours) at 1425° C., neither of which is convenient for industrial production. Furthermore, the purity of the latter materials was not reported.

OBJECTS OF THE INVENTION

Accordingly, it is an object of the present invention to provide a new and improved method for the growth of silicon nitride whiskers which is a simple and convenient technique readily implemented industrially.

It is another object of the present invention to provide a technique for the growth of silicon nitride whiskers of high purity, suitable for use in structural ceramics intended for vehicular engine applications.

The advantages of this process will become apparent from the description below. Further and other objects of the present invention will become apparent from the description contained herein.

SUMMARY OF THE INVENTION

In accordance with one aspect of this invention, a new and improved method for making silicon nitride whiskers having a purity greater than 99.9% comprises the steps:

Step 1—From about 0.5 to about 10 parts of carbon are mixed with one part of silicon dioxide to form a mixture.

Step 2—From about 0.001 to about 0.5 weight percent of a whisker forming additive is added to the mixture from step 1.

Step 3—The product from step 2 is heated in a graphite container from about 1400° C. to about 1550° C. for about 2 to about 12 hours in a flowing nitrogen atmosphere at about 0.5 to about 5 cm/sec to grow whiskers of alpha silicon nitride having an aspect ratio greater than 10 and a purity greater than 99.9%.

For a better understanding of the present invention together with other and further objects, advantages and capabilities thereof, reference is made to the following disclosure and appended claims in connection with the above-described drawings.

DETAILED DESCRIPTION OF THE INVENTION

An intimate mixture of carbon and silicon dioxide is prepared to which are added small amounts of transition metals such as chromium, magnesium, and nickel. The carbon and silica are mixed in a weight ratio in the range of 0.5 to 10 with the preferred ratio being in the range of 1 to 4 and particularly 2 (two parts by weight of carbon to one of silica). Any combination of silica and carbon materials is suitable for whisker growth but, in order to minimize impurity content, the experiments were conducted using Cab-O-Sil M-5 silica and Monarch 1100 carbon, both manufactured by the Cabot Corporation, Boston, Mass. The metallic whisker growth promoters are added in the form of fine metal powders or as oxides or salts decomposable to oxides upon heating. The amount added is in the range of 0.001 to 0.5 w/o of the carbon and silica mixture with 0.005 to 0.05 w/o being the preferred range.

The material mixture is placed in a suitable container, such as a graphite boat, and heated in a flowing nitrogen gas atmosphere at temperatures in the range of 1400° C.–1550° C. for periods between 2 and 12 hours. The preferred heat treatment is for 7 hours at 1480° C. with a nitrogen gas velocity of 2.5 cm/sec, although velocities in the range of 0.5–5 cm/sec are useful.

Figure 1:
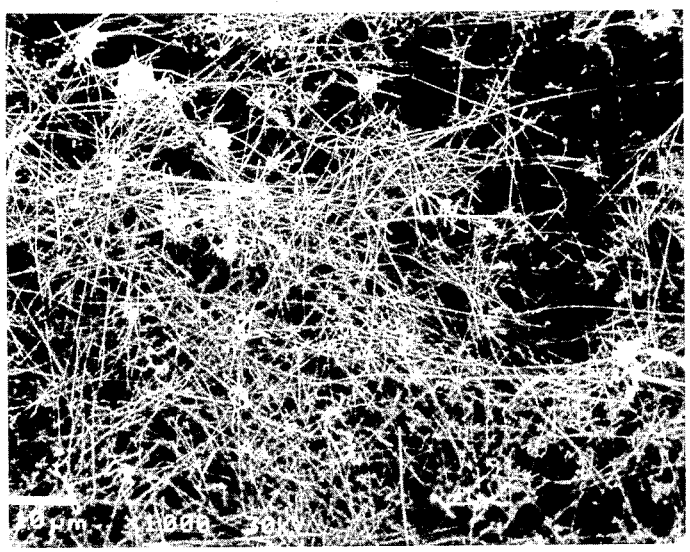
FIG. 1 is a SEM, scanning electron microscope photograph, of silicon nitride whiskers of the present invention magnified at 1000×.
Figure 2:
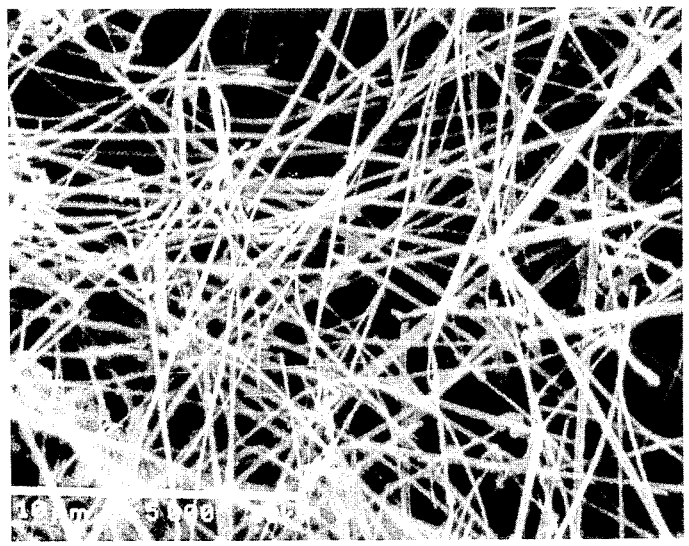
FIG. 2 is a SEM of FIG. 1 magnified at 5000×.
Figure 3:
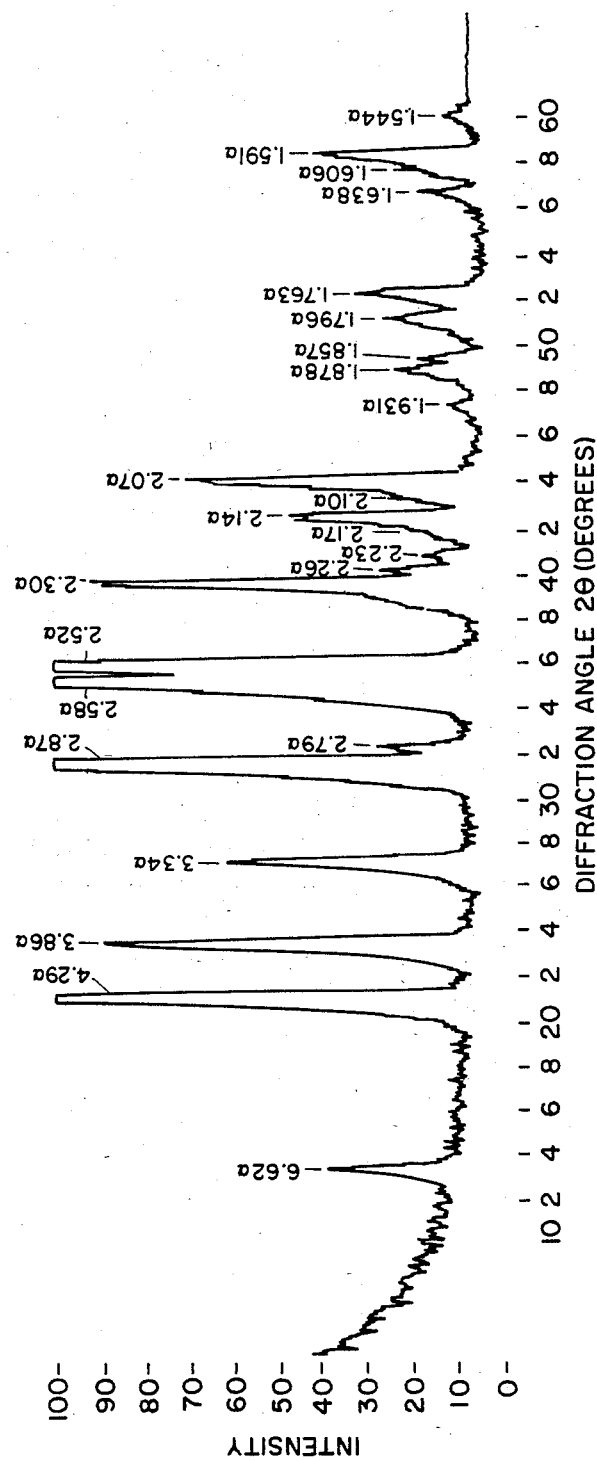
FIG. 3 is an X-ray diffraction chart of silicon nitride whiskers of the present invention.

The product of this reaction consists of two parts. The bottom part, hereafter referred to as the substrate layer, is a mixture of carbon and silicon nitride which is usually obtained in the synthesis of silicon nitride by carbothermal reduction of silica. The conditions outlined above are appropriate for this purpose. A light and spongy upper layer is found atop the substrate layer which consists of filament-like particles of large aspect ratio as shown in scanning electron microscope photographs (FIGS. 1 and 2). These particles are tens of microns long and a fraction of a micron wide thereby having an aspect ratio greater than 10. X-ray diffraction shows these whiskers to consist of alpha-$Si_3N_4$ (FIG. 3).

The growth of the whiskers occurs only in the presence of the metal impurities in the substrate layer; in their absence no whisker formation takes place (see reference sample in Table I). The growth mechanism is thought to occur through the vapor phase as indicated by the very light, almost white color of the whisker layer grown atop a carbon/silicon nitride powder bed. This postulate is supported by the low level of impurities observed in the whisker layer as compared to the substrate bed on which it was grown (see Table I). It is believed that the presence of the metal promotes the reduction of silicon dioxide to silicon monoxide by the carbon in the system. The silicon monoxide, which is a vapor species at the growth temperatures, reacts in the gas phase with the nitrogen gas flowing in the system to form silicon nitride, which crystallizes on nucleation centers of the substrate layer. Subsequent crystal growth occurs in whisker form on these crystalline nuclei. The resulting crystalline whiskers are very pure (see Table I) because only the vapor phase species silicon monoxide is involved in the whisker forming reaction while the metal powders remain in the substrate layer. The whiskers grown in this manner are much purer than those obtained by other techniques (see Table II) and therefore better suitable for structural ceramic applications.

EXAMPLE

A mixture of 1 part by weight of M-5 grade silicon dioxide and 2 parts by weight of Monarch 1100 grade carbon black was heated in a graphite boat at 1480° C. for 7 hours in a stream of nitrogen flowing at a velocity of 2.5 cm/sec. No whisker formation was observed in this experiment which is being included here as a reference example. The contents of the boat was then heated at 600° C. in air to oxidize and volatilize the excess carbon as carbon dioxide. X-ray diffraction of the powder residue found it to be alpha-$Si_3N_4$ with a minor phase of beta-$Si_3N_4$; the impurity levels of this powder, as determined by semi-quantitative emission spectroscopy, are listed in Table I.

Another preparation was made in an identical fashion, using the same lots of the M-5 and Monarch 1100 reactants but adding to the reactant mixture about 0.006 w/o of chromium, 0.006 w/o of nickel and 0.014 w/o of magnesium. A light spongy layer up to 1 cm in thickness and easily separable was found atop the substrate layer. This layer consisted of whisker-like crystallites of high aspect ratio, greater than 10 (FIGS. 1 and 2). Examination of these whiskers by X-ray diffraction showed them to be only single phase alpha-$Si_3N_4$ (FIG. 3). The semi-quantitative emission spectroscopic analysis of the whiskers shows that they are much purer that the substrate on which they were grown (see Table I) confirming the vapor phase mechanism for their growth. The resulting whiskers are much purer than those prepared by other techniques (see Table II).

The data in Table I shows that the key elements in the promotion of whisker growth are chromium, magnesium and nickel because they are present in a concentration of several hundred ppm in the substrate layer and in a much greater concentration in the substrate layer than in the reference material which did not produce whiskers. The data in Table II show the advantage of this growth technique which results in whiskers with impurity levels which are in some cases as much as two orders of magnitude lower than those of the best silicon nitride whiskers prepared to date. [The chromium, magnesium and nickel impurity levels reported in Table I for the substrate layer are different and greater than the amounts added to the starting reactant mixture because the silicon nitride yield is of the order of 20% of the initial mass. Silica comprises only 33.3% of the reactant mixture and in its carbothermal conversion to silicon nitride $$3\ SiO_2 + 6C + 2N_2 \longrightarrow Si_3N_4 + 6CO$$

MW: 3 × 60 = 180      MW: 140 it can yield no more than 77.8% of its original weight and thus only 25.9% of the initial reactant weight. The overall yield of silicon nitride was excellent, exceeding 90% of the theoretical value of 25.9%. A portion of it was used up in the growth of the whiskers while the remainder, about 20% of the original reactant weight, formed the substrate layer].

TABLE I

| | Impurity Content of $Si_3N_4$ Materials | | |
|---|---|---|---|
| Element (in ppm) | Whisker Layer | Substrate Layer | Reference* Example |
| Fe | 100 | 1000 | 700 |
| Cr | n.d. (<10) | 300 | n.d. (<10) |
| Al | 10 | 200 | 300 |
| Mg | 10 | 700 | 100 |
| Ti | 20 | 20 | 10 |
| Cu | 20 | 80 | n.d. (<10) |
| Mn | <10 | 30 | 50 |
| Ni | 10 | 300 | 10 |
| Mo | <10 | 50 | <10 |
| V | n.d. (<10) | n.d. (<10) | 10 |
| Ca | n.d. (<100) | 500 | 800 | n.d. ( ) - not detected (detectability limit)
*no whisker formation

TABLE II

| | Impurity Levels of $Si_3N_4$ Whiskers | | |
|---|---|---|---|
| Element (in ppm) | This Invention | Los Alamos* | Tateho** |
| Mg | 10 | 250 | 2000 |
| Al | 10 | 2500 | 1000 |
| Ca | n.d. (<100)+ | 100 | 1200 |
| Ti | 20 | 40 | 50 |
| Cr | n.d. (<10)+ | 30 | 70 |
| Mn | 10 | 40 | 150 |
| Fe | 100 | 800 | 2000 |
| Ni | 10 | 50 | 60 |

*J. V. Milewski et al, Rpt. DE83008282, Los Alamos National Laboratory, Feb. 1983.
**loc. cit.
+n.d. ( ) - not detected (detectability limit)

While there has been shown and described what is at present considered the preferred embodiment of the invention, it will be obvious to those skilled in the art that various changes and modifications may be made therein without departing from the scope of the invention as defined by the appended claims.

What is claimed is:

1. A method of making silicon nitride whiskers having a purity greater than 99.9% comprising the steps:
Step 1—mixing from about 0.5 to about 10 parts of carbon with one part silicon dioxide forming a mixture;
Step 2—adding from about 0.001 to about 0.5 weight percent of a whisker forming additive to the mixture from step 1, said whisker forming additive being selected from the group consisting of the metal, oxide, salt of chromium, nickel, magnesium, and combinations thereof, said salt being convertible to an oxide by heating;

Step 3—heating the produce from step 2 in a graphite container from about 1400° C. to about 1550° C. for about 2 to about 12 hours in a flowing nitrogen atmosphere at about 0.5 to about 5 cm/sec to form whiskers of alpha silicon nitride having an aspect ratio greater than 10 and a purity greater than 99.9%.

2. A method of making silicon nitride whiskers in accordance with claim 1 wherein said step 2 comprises adding from about 0.005 to about 0.05 weight percent of a whisker forming additive to the mixture from step 1.

3. A method of making silicon nitride whiskers in accordance with claim 1 wherein said step 1 comprises mixing from about 1 to about 4 parts of carbon with one part of silicon dioxide forming a mixture.

4. A method of making silicon nitride whiskers in accordance with claim 1 wherein said step 1 comprises mixing about 2 parts of carbon with one part of silicon dioxide forming a mixture.

5. A method of making silicon nitride whiskers in accordance with claim 1 wherein said whiskers forming additive being selected from the group consisting of the metals of chromium, nickel, magnesium, and combinations thereof.

* * * * *